United States Patent
Shaw (10) Patent No.: US 9,935,591 B2
(45) Date of Patent: Apr. 3, 2018

(54) METHOD AND APPARATUS FOR CURRENT STEERING IN HIGH SENSITIVITY, HIGH LINEARITY AND LARGE DYNAMIC RANGE HIGH SPEED TRANS-IMPEDANCE AMPLIFIERS

(71) Applicant: Integrated Device Technology, Inc., San Jose, CA (US)

(72) Inventor: Michael Shaw, Granite Bay, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/948,052

(22) Filed: Nov. 20, 2015

(65) Prior Publication Data

US 2016/0149540 A1    May 26, 2016

Related U.S. Application Data

(60) Provisional application No. 62/083,058, filed on Nov. 21, 2014.

(51) Int. Cl.

| | |
|---|---|
| H03F 3/08 | (2006.01) |
| H03G 1/00 | (2006.01) |
| H03F 1/08 | (2006.01) |
| H03F 1/32 | (2006.01) |
| H03F 1/34 | (2006.01) |
| H03F 3/45 | (2006.01) |
| H03F 3/68 | (2006.01) |

(52) U.S. Cl.
CPC ............ *H03F 3/082* (2013.01); *H03F 1/086* (2013.01); *H03F 1/3205* (2013.01); *H03F 1/342* (2013.01); *H03F 3/45475* (2013.01); *H03F 3/68* (2013.01); *H03G 1/0023* (2013.01); *H03G 1/0035* (2013.01); *H03F 2200/153* (2013.01); *H03F 2200/408* (2013.01); *H03F 2200/462* (2013.01); *H03F 2203/45138* (2013.01); *H03F 2203/45652* (2013.01)

(58) Field of Classification Search
CPC ............... H03F 3/08; H03F 3/082; H03F 3/45
USPC ....... 330/254, 260, 308; 250/214 A, 214 AG
See application file for complete search history.

(56) References Cited

U.S. PATENT DOCUMENTS

| | | | | |
|---|---|---|---|---|
| 6,114,913 A | * | 9/2000 | Entrikin | ............. H03F 3/08 |
| | | | | 250/214 A |
| 2004/0196105 A1 | * | 10/2004 | Filip | ............. H03F 3/08 |
| | | | | 330/308 |
| 2008/0308713 A1 | | 12/2008 | Keith et al. | |

OTHER PUBLICATIONS

Written Opinion of the International Searching Authority for PCT Application PCT/US2015/061981; dated Feb. 4, 2016; 4 pages.

* cited by examiner

*Primary Examiner* — Steven J Mottola
(74) *Attorney, Agent, or Firm* — Haynes and Boone, LLP.

(57) ABSTRACT

The present invention relates to a linear, high sensitivity, high speed trans-impedance amplifier (TIA) which allows a large dynamic range of input current up to very large values, maintains high linearity and keeps constant output voltage, maintains the same frequency response across the full gain control range, provides very high input sensitivity and large bandwidth, and allows input current monitoring without affecting input sensitivity. In other words, the novel circuit disclosed herein provides for the feedback path to maintain the same level of feedback even while the output signal is varied. This allows a wide and stable bandwidth, as well as a monitor to be placed in the TIA.

14 Claims, 12 Drawing Sheets

PRIOR ART

Min Bandwidth

Nominal Bandwidth

Max Bandwidth

METHOD AND APPARATUS FOR CURRENT STEERING IN HIGH SENSITIVITY, HIGH LINEARITY AND LARGE DYNAMIC RANGE HIGH SPEED TRANS-IMPEDANCE AMPLIFIERS

CROSS REFERENCE TO RELATED APPLICATIONS

This application claims the benefit of U.S. Provisional Application No. 62/083,058, filed Nov. 21, 2014, the contents of which are incorporated herein by reference in its entirety.

FIELD OF INVENTION

The field of invention is a current steering in high sensitivity, high linearity and large dynamic range high speed trans-impedance amplifiers.

BACKGROUND

In electronics, a trans-impedance amplifier (TR) is essentially a current-to-voltage converter. The TIA may be configured to amplify an input current from an electrical component, such as a sensor or photodiode, to a usable voltage in a particular circuit. TIAs are typically implemented using operational amplifiers.

Figure 1:
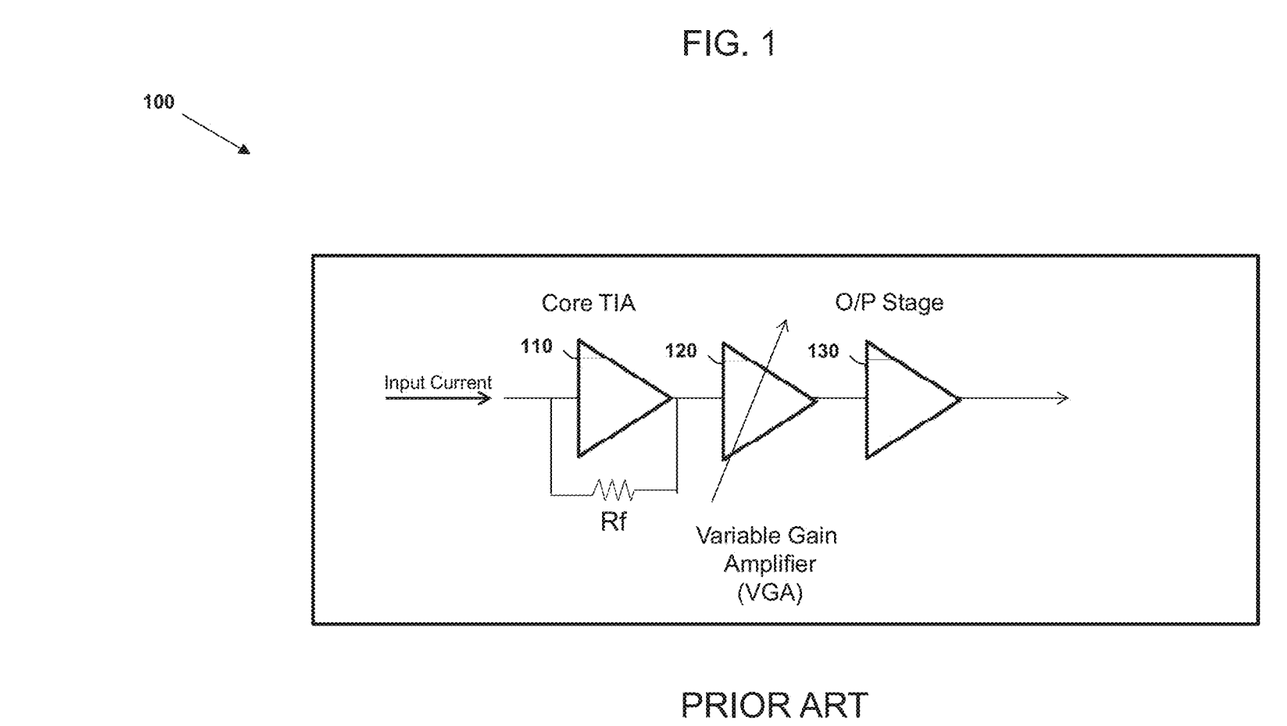
FIG. 1 illustrates a circuit diagram of an example prior art TIA.

FIG. 1 illustrates a prior art TIA 100, having a core TIA 110, a linear variable gain amplifier (VGA) 120 and an output stage 130. For such a typical, high linear TIA 100, the automatic gain control is achieved by means of the linear VGA 120, situated between the first core TIA 110 and the output stage 130. In that regard, gain control (or gain variation) is performed exclusively at the second stage of the TIA 100, which is at the linear VGA 120. With respect to this design, the disadvantage is that the core TIA 110 starts to degrade linearity for large input signals. The higher the gain of the core TIA 110, the better the sensitivity; however, the linearity will be degraded more for such large input signals.

Figure 2:
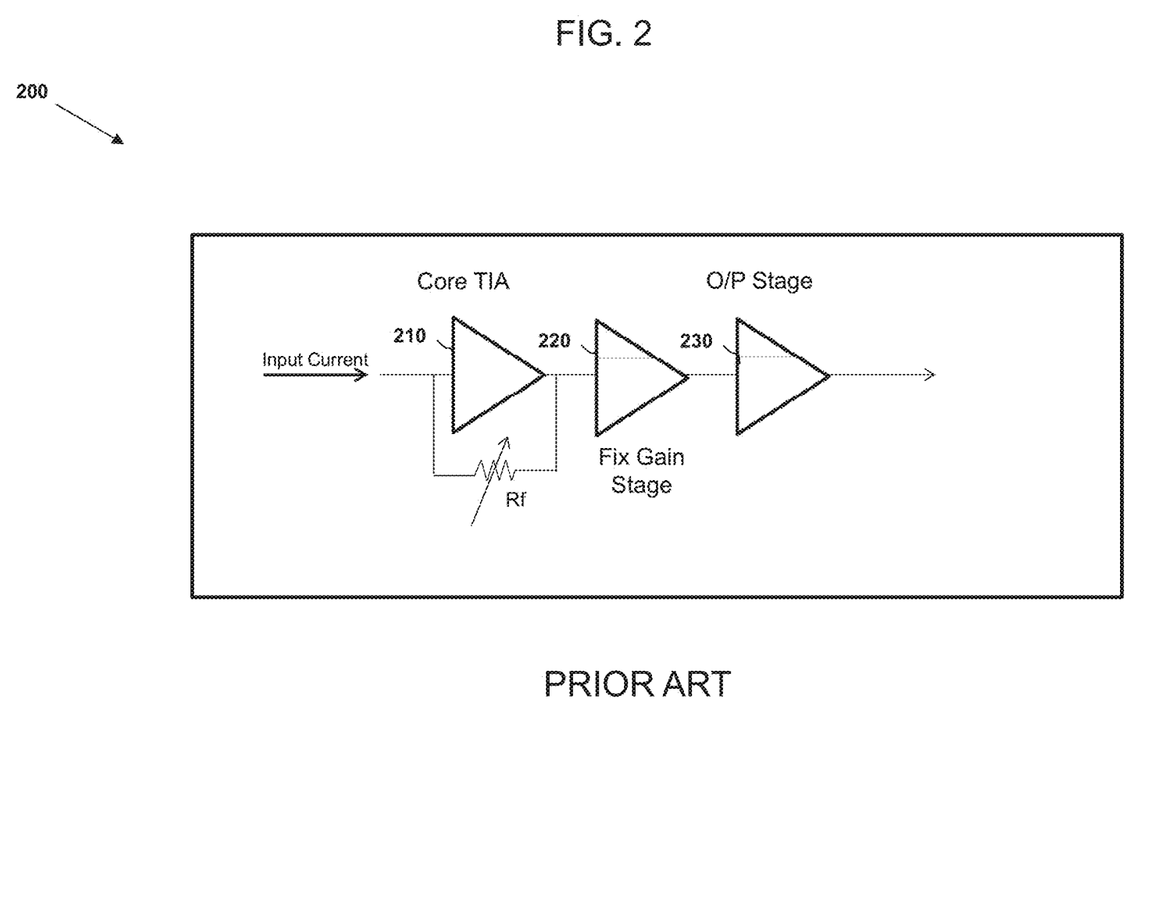
FIG. 2 illustrates a circuit diagram of another example prior art TIA.

FIG. 2 illustrates another prior art TIA 200, having a core TIA 210, a fixed gain stage amplifier 220 and an output stage 230. In this configuration, gain control is typically performed with external components coupled to the core TIA 210, such as the core TIA feedback resistance Rf. The output is then fed into the fixed gain stage 220 (which substitutes the VGA 120 illustrated in FIG. 1). However, similar to the TIA design of FIG. 1, this approach also suffers from significant disadvantages and drawbacks. In particular, the dynamic range of control is limited, and the frequency response changes with the variation of Rf (Gain). Moreover, in the approach of FIG. 2, circuitry for the input monitor must be located at the input of the TIA 200, which also affects input sensitivity.

In view of the aforementioned disadvantages and drawbacks in the prior art, there is a need for a high sensitivity, high linearity and large dynamic range high speed TIA.

SUMMARY OF TITLE INVENTION

The present invention relates to a linear, high sensitivity, high speed TIA. For example, the TIA allows a large dynamic range of input current up to very large values, maintains high linearity and keeps constant output voltage, maintains the same frequency response across the full gain control range, provides very high input sensitivity and large bandwidth, and allows input current monitoring without affecting input sensitivity. Moreover, the novel circuit disclosed herein, in accordance with an aspect of the disclosure, provides for the feedback path to maintain the same level of feedback even while the output signal is varied. This allows a wide and stable bandwidth, as well as a monitor to be placed in the TIA.

In one aspect of the disclosure, a core TIA is provided with current steering gain control. For example, the current steering gain control circuitry may be implemented in the core TIA circuitry using one or more electrical components, such as a transistor, resistor, etc., or combinations thereof. In that regard, the current steering gain control varies the gain by varying current, while maintaining voltage feedback and the input monitor voltage and/or signal. As such, gain variation is performed at the very front end of the TIA of the present disclosure, for example, in the core TIA itself. By varying the gain at the front end, a variable output exists and the signal characteristics, e.g., amplitude, of the output of the core TIA may be commensurate with the signal characteristics of the subsequent stages of the TIA so that dynamic range can be improved.

In a further aspect of the disclosure, the core TIA is provided with constant feedback via, for example, constant feedback loop circuitry, again using various electrical components, such as resistors, transistors, etc., so that the input and the characteristics of the TIA itself (e.g., current-to-voltage characteristic) are maintained with the feedback.

In yet another aspect of the disclosure, the core TIA is provided with an input monitor via input monitor circuitry, which allows for an application using the TIA to align one or more optical fibers, for example, to one or more sensors (e.g., photodiodes) emitting input signals, by using this input monitor.

In another aspect of the disclosure, the core TIA may be coupled to a second stage amplifier. By way of example, the second stage amplifier may be a fixed gain amplifier. The second stage amplifier may then be coupled to an output buffer. In that regard, the coupling of the core TIA, the fixed gain amplifier, and the output buffer, collectively, may be considered the TIA. In some examples, multiple TIAs may be arranged together in a package (connected or disconnected) to form a multichannel TIA.

As will be further discussed below, the configuration of the core TR with current steering gain control, feedback loop, and input monitoring has various and numerous advantages. For example, overall current of a system implementing the TIA of the present disclosure is reduced, which makes the overall system more efficient. Further, the TIA improves Total Harmonic Distortion (THD), improves noise, and improves overall dynamic range while allowing linearity and low noise feedback across all stages of the TIA.

Other objects, advantages and novel features of the present invention will become apparent from the following detailed description of one or more preferred embodiments when considered in conjunction with the accompanying drawings. It should be recognized that the one or more examples in the disclosure are non-limiting examples and that the present invention is intended to encompass variations and equivalents of these examples. The disclosure is written for those skilled in the art. Although the disclosure use terminology and acronyms that may not be familiar to the layperson, those skilled in the art will be familiar with the terminology and acronyms used herein.

DETAILED DESCRIPTION OF THE INVENTION

In accordance with the need in the art, the invention is directed to a linear, high sensitivity, high speed TIA which allows a large dynamic range of input current up to very large values, while maintaining high linearity and keeping constant output voltage, e.g., Automatic Gain Control (AGC) Mode. The TIA further tends to maintain the same frequency response across the full gain control range in AGC mode, while providing very high input sensitivity and large bandwidth, and allowing input current monitoring without affecting input sensitivity. In other words, the novel circuit disclosed herein provides for the feedback path to maintain the same level of feedback even while the output signal is varied. This allows a wide and stable bandwidth, as well as a monitor to be placed in the TIA.

Figure 3A:
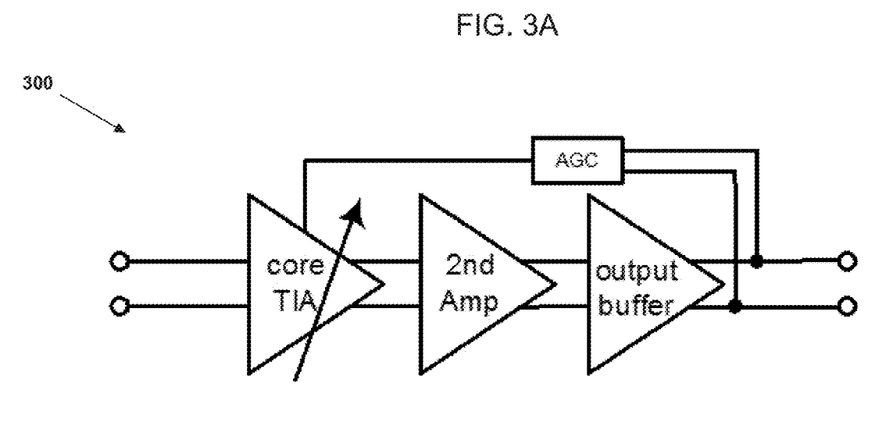
FIG. 3A illustrates a circuit diagram of a TIA in accordance with one or more aspects of present disclosure.

The aforementioned features are achieved by at least the novel TIA design, as shown by the all the figures in the present disclosure. For example, FIG. 3A illustrates a circuit diagram of TIA 300. The TIA 300 includes a core TIA, a second amplifier, a buffer, and an AGC block. As shown, the core TIA is configured to have variability (as illustrated by the arrow symbol), which means that the core TIA itself performs gain control or gain variation. The AGC block connects between the core TIA and the output of the output buffer, which indicates automatic gain control. As will be further discussed below with respect to FIGS. 5 and 6, the second amplifier may be a fixed gain amplifier and the buffer may be an output buffer. By varying the gain at the front end of the chain (the core TIA), the signal characteristics, e.g., amplitude, at the output of the core TIA may be commensurate with the signal characteristics of the subsequent stages, such as the second amplifier and the buffer, so that overall dynamic range of the TLA 300 is improved.

Figure 3B:
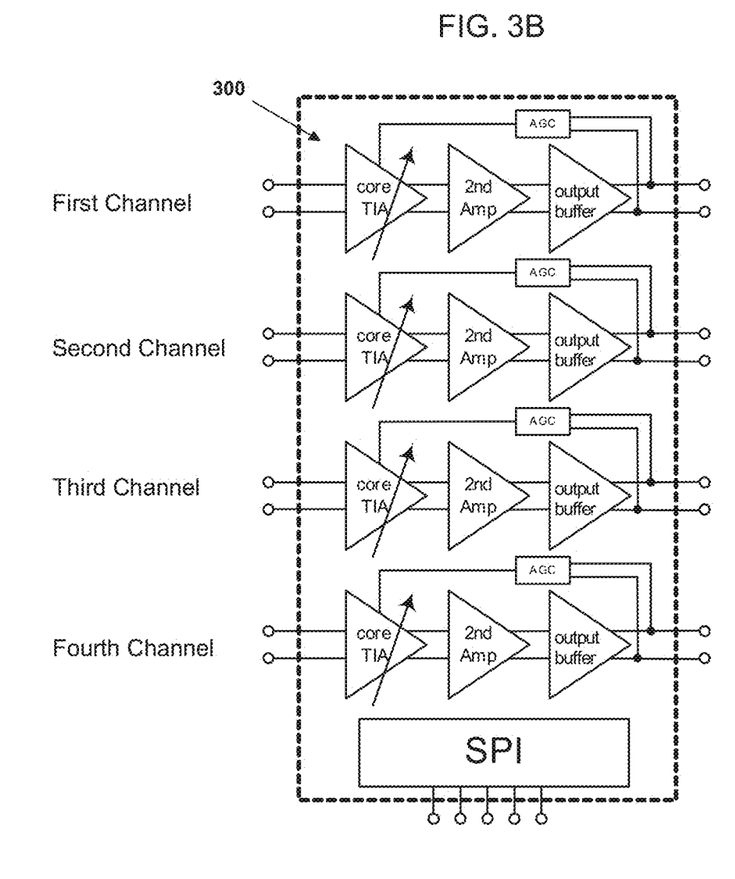
FIG. 3B illustrates a circuit diagram of a multichannel TIA in accordance with one or more aspects of the present disclosure.

FIG. 3B illustrates a circuit diagram of a multichannel TIA in accordance with aspects of the disclosure. As suggested, the muitichannel TIA may include multiple channels of TIAs. For example, the TIA 300 of FIG. 3A can be implemented as one of the channels. As shown, TIA 300 is implemented as the First Channel, and additional TIAs (either identical or of similar configuration to TIA 300) are implemented as the Second Channel, the Third Channel, and the Fourth Channel. In this example, the TIAs of the Second, Third, and Fourth channels are configured identically to the TIA 300. For instance, the Second Channel includes a core TIA with variable gain control, the output of which is feeding into an input of a second amplifier, and the output of the second amplifier feeding into the input of the output buffer.

Figure 4A:
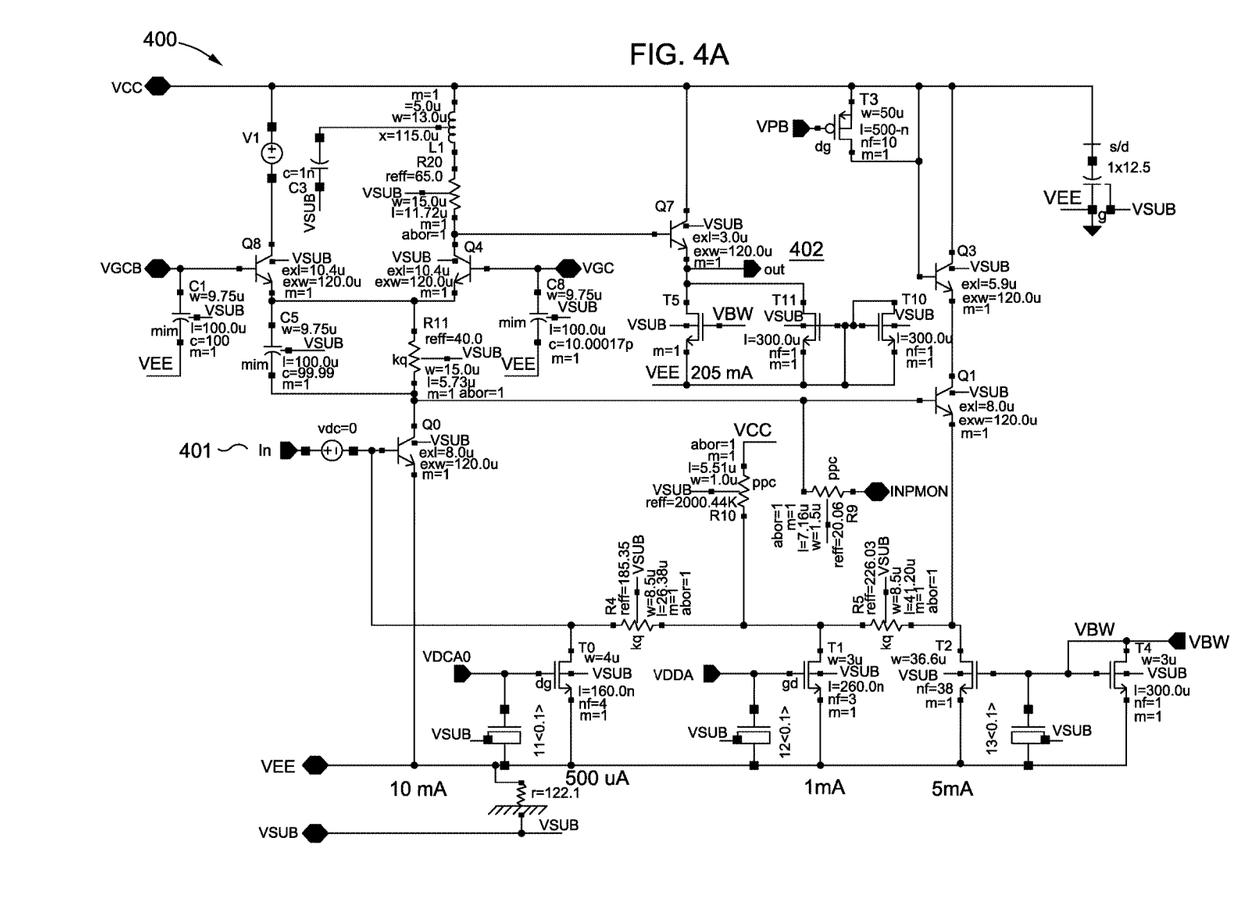
FIG. 4A illustrates a schematic diagram of a core TIA circuitry in accordance with one or more aspects of the present disclosure.

FIGS. 4A-D are schematic diagrams of the core TIA and various components thereof. For example, FIG. 4A illustrates a schematic diagram of the core TIA 400 in accordance with aspects of the present disclosure. As illustrated, the core TIA 400 may have various electrical components, such as resistors, inductors, capacitors, transistors, metal-oxide-semiconductor field-effect transistors (MOSFETs), nodes, connections, etc. Moreover, the core TIA 400 includes an input pin 401 (as shown on the left-hand side of the schematic diagram) and also includes an output pin 402 (as shown on the upper half of the schematic diagram). In another embodiment, capacitor CS is optional and need not be part of the feedback load.

Figure 4B:
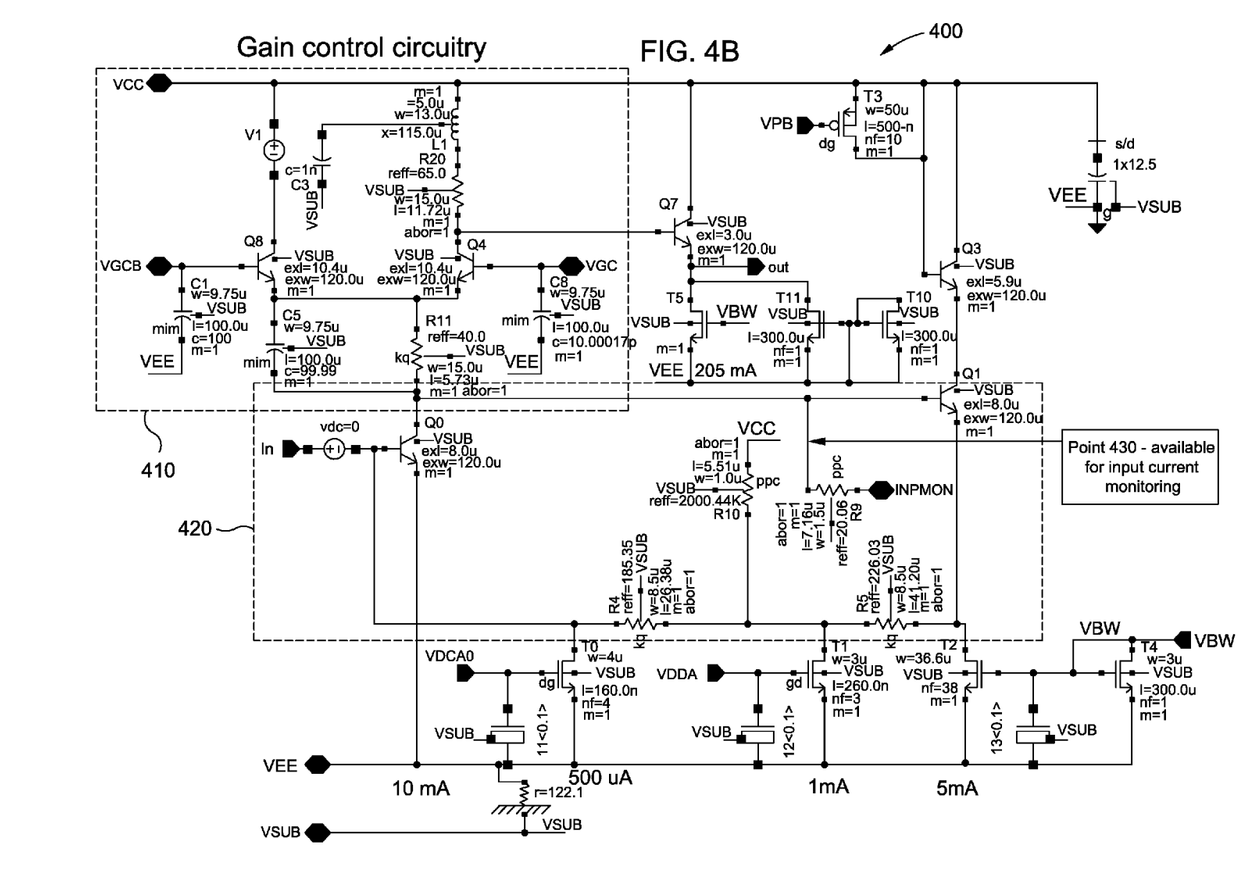
FIG. 4B illustrates gain control circuitry, feedback loop circuitry, and an input monitoring point of the schematic of FIG. 4A in accordance with one or more aspects of the present disclosure.

Within the circuitry of the core TIA 400, there may be gain control circuitry 410, feedback loop circuitry 420, and an input current monitoring point 430. FIG. 4B shows where these features are located within the context of the schematic of the core TIA 400, as illustrated in FIG. 4A. By way of example only, the gain control circuitry is configured and/or arranged above the input pin 401 toward the top left-hand corner of the schematic of the core TIA 400. Moreover, the feedback loop circuitry 420 is configured and/or arranged below the gain control circuitry 410 and to the right side of the input pin 401. The input current monitoring may occur at point 430, which is depicted adjacent to the pin labeled "INPMON" (or otherwise known as input monitoring). At least these features of the core TIA 400 allow the TR 300 to maintain the same frequency response across the full gain control range in AGC mode, while providing very high input sensitivity and large bandwidth, and allowing input current monitoring without affecting input sensitivity.

Figure 4C:
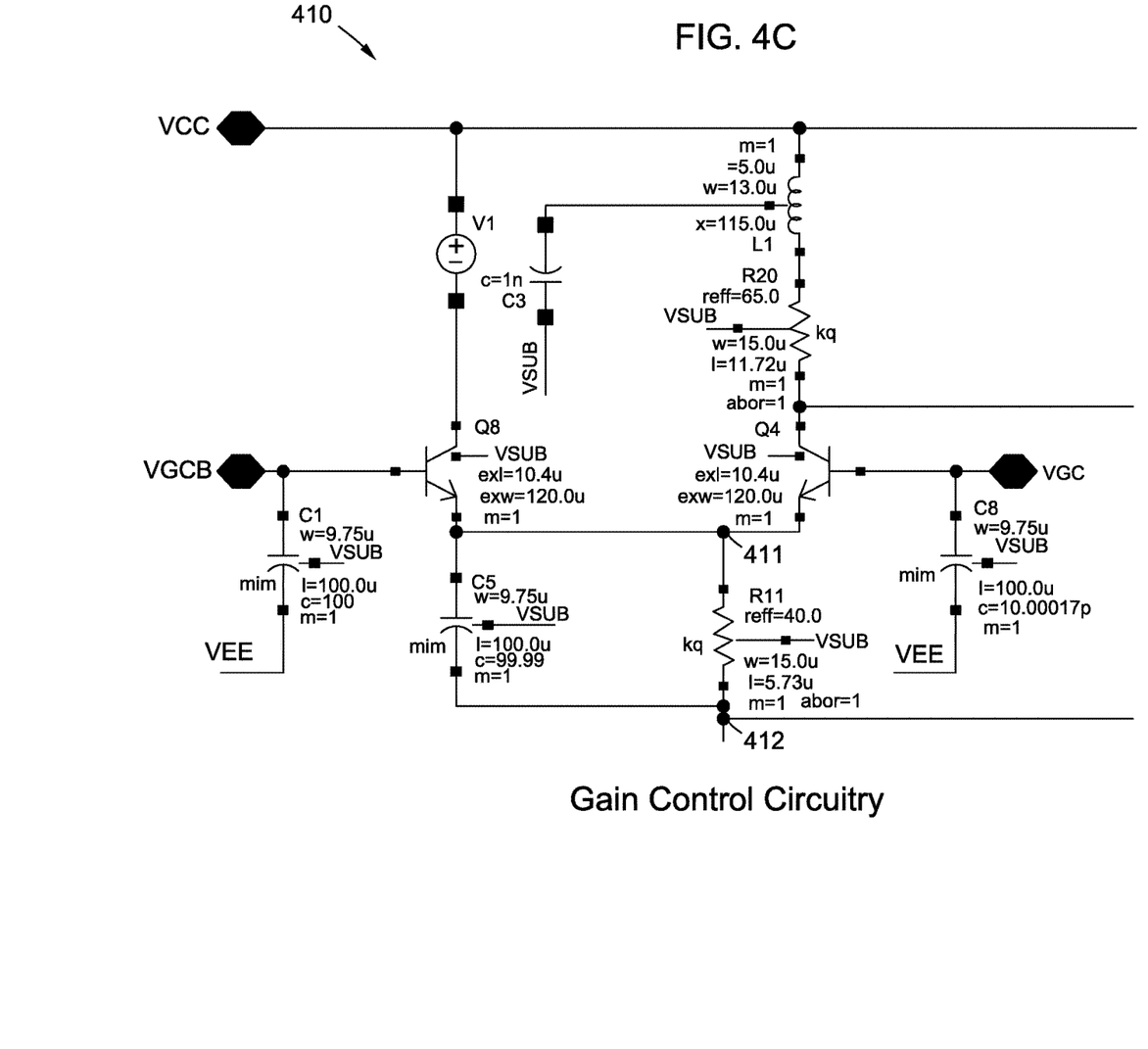
FIG. 4C illustrates a schematic diagram of the gain control circuitry in accordance with one or more aspects of the present disclosure.

FIG. 4C illustrates a schematic diagram of the gain control circuitry 410 of the core TIA 400 in accordance with aspects of the present disclosure. For example, variable gain occurs by steering current either to a supply source and/or a signal output. As shown in FIG. 4C, the current going up and through resister R11 may be steered by transistor Q8 and transistor Q4. In other words, these transistors perform the gain control by dumping off current or feeding current into the signal path. The emitters of the transistors exhibit low impedance characteristics, but also allows for current input. By way of example only, as more current goes up through transistor Q8 and to the supply source, less current and/or signal goes through transistor Q4 to the output and then to the subsequent stages of the TIA 300 allowing for operation at a lower supply current and improving overall efficiency.

Further shown in FIG. 4C are nodes 411 and 412, which are arranged at opposed ends of the resistor R11. Node 411 is essentially at a constant voltage (e.g., similar to a supply voltage). However, the voltage swing at the other side of resistor R11, at node 412, creates a feedback signal that is fed back into transistor Q1, which is part of the feedback loop circuitry 420. Because of the current steering gain control functionalities of the gain control circuitry 410, the feedback voltage of the core TIA 400 does not change, unlike prior art approaches where feedback changes as the gain changes. In that regard, voltage feedback occurs inside the core TIA 400 along with current attenuation, and subsequent stages of the TIA 300 are able to operate at a lower supply current because the dynamic range requirements are reduced.

Figure 4D:
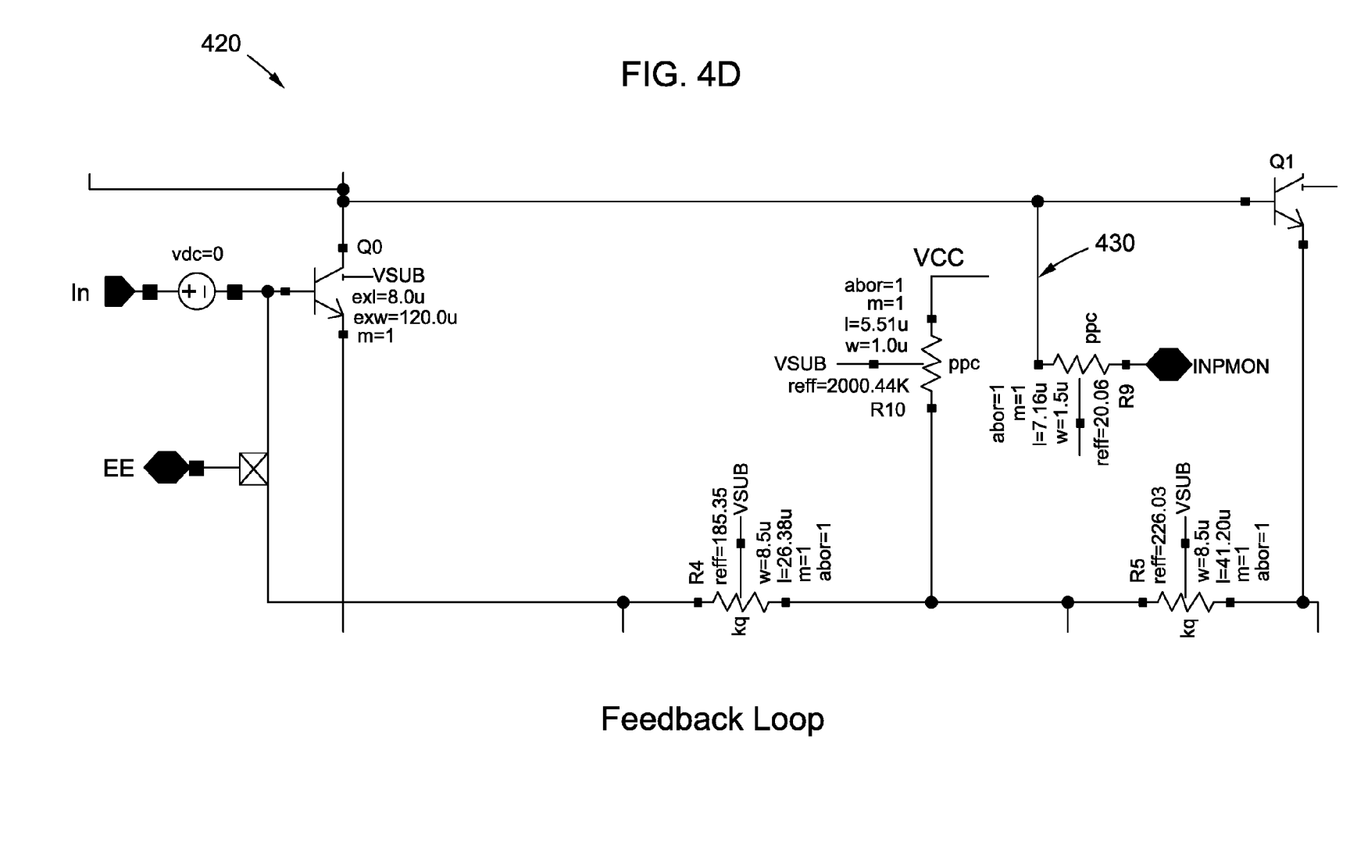
FIG. 4D illustrates a schematic diagram of the feedback loop circuitry in accordance with one or more aspects of the present disclosure.

FIG. 4D illustrates a schematic diagram of the feedback loop circuitry 420 with the input monitoring point 430 in accordance with aspects of the present disclosure. The feedback loop circuitry includes transistor Q1, resistor R5, resistor R4, and transistor Q0. As shown, an input signal via input pin 401 goes through transistor Q0, which is the main transistor amplifier. Moreover, the RF amplifier is configured by the arrangement of transistor Q0 along with the collector load (e.g., inductor L2, resistor R7 and resistor R8). As shown, the feedback path includes the voltage output being fed back into resistor R5 and resistor R4 and back into the input of transistor Q0. And as described above, the feedback signal created at node 412 also gets fed into transistor Q1. In this regard, the input and the characteristics of the TIA (e.g., current-to-voltage characteristic) are maintained with the feedback.

Figure 5:
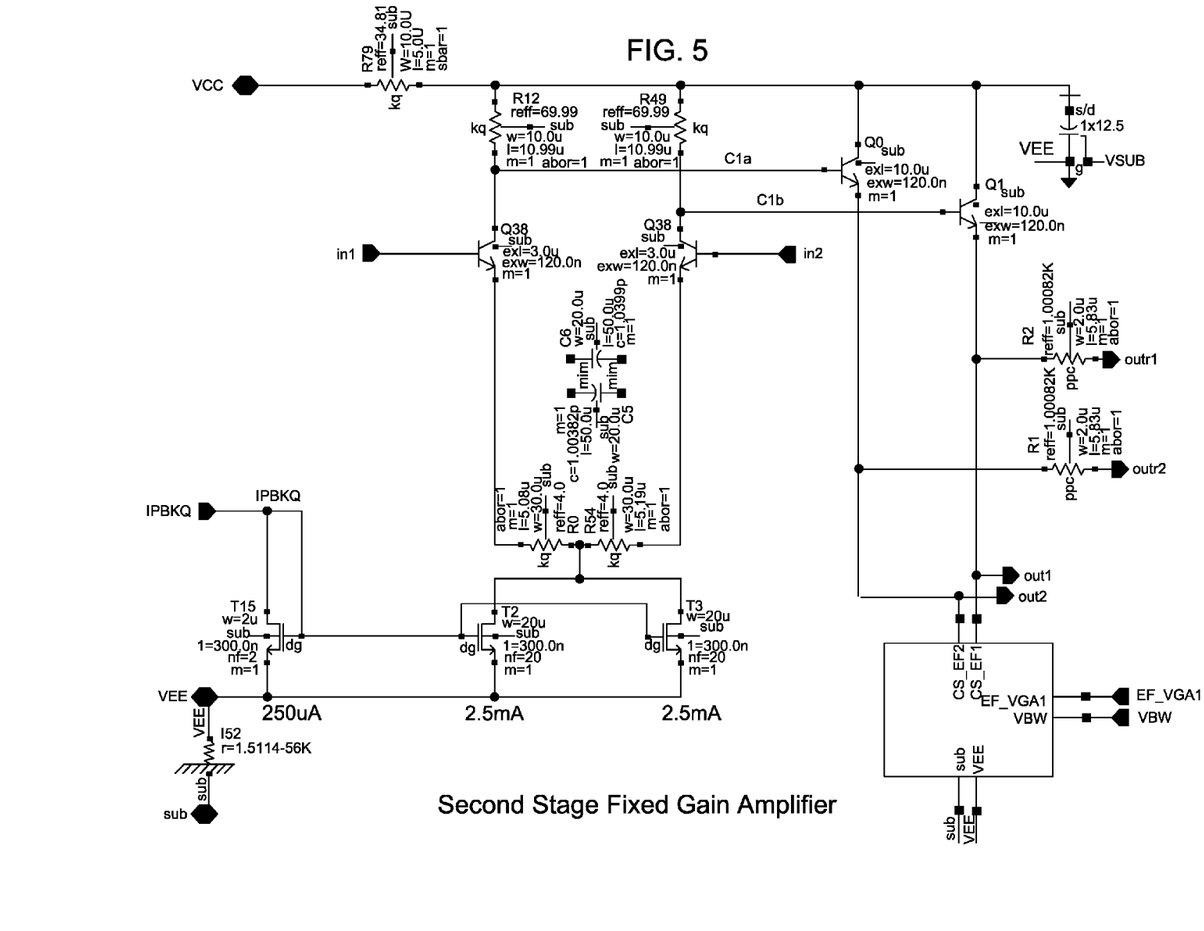
FIG. 5 illustrates a schematic diagram of a second stage fixed gain amplifier in accordance with one or more aspects of the present disclosure.

FIG. 5 illustrates a schematic diagram of a second stage amplifier in accordance with aspects of the present disclosure. The second stage amplifier may have various electrical components, such as resistors, inductors, capacitors, transistors, metal-oxide-semiconductor field-effect transistors (MOSFETs), nodes, connections, etc. Here, the second stage amplifier is a fixed gain amplifier, similar to the one shown in FIGS. 3A-B. As illustrated, the second stage amplifier takes the output of the core TIA 400 into two inputs. The second stage amplifier also includes two outputs. Any gain that is present in the second stage amplifier of FIG. 5 is constant and not varied.

Figure 6:
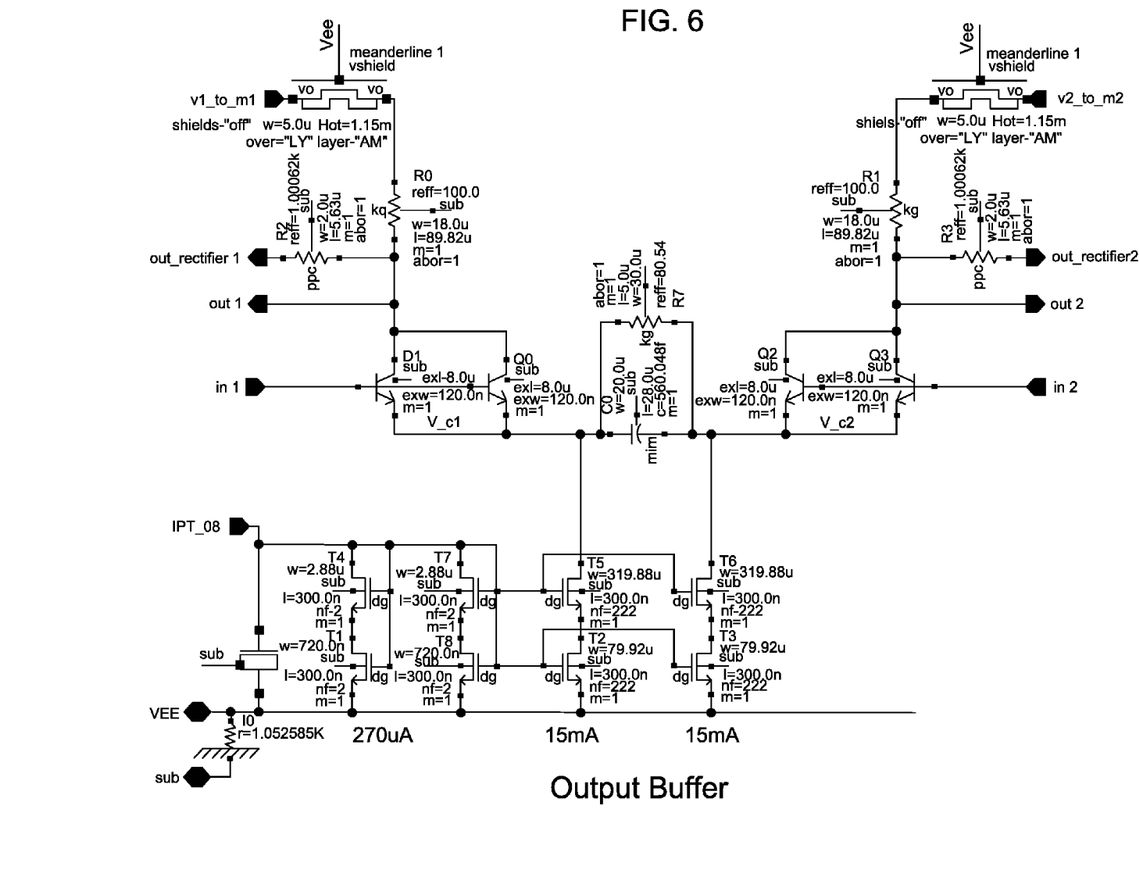
FIG. 6 illustrates a schematic diagram of an output buff accordance with one or more aspects of the present disclosure.

FIG. 6 illustrates a schematic diagram of an output buffer in accordance with aspects of the present disclosure. Similar to the fixed gain amplifier of FIG. 5, the output buffer may have various electrical components, such as resistors, inductors, capacitors, transistors, metal-oxide-semiconductor field-effect transistors (MOSFETs), nodes, connections, etc. Moreover, the output buffer of FIG. 6 has two inputs and two outputs. The output buffer also exhibits constant gain.

FIGS. 7 and 8A-C illustrate optical eye diagrams of input and output signals of the TIA 300 in accordance with aspects of the present disclosure. The optical eye diagrams may indicate the quality of the signals being inputted and outputted and may be generated by an instrument, such as an oscilloscope, by overlaying sweeps of segments of a data stream by a master clock. The optical eye diagrams may indicate an amount of distortion, which may be set by the signal-to-noise ratio, signal-to-noise ratio at a particular sampling point, jitter, time variations, etc.

Figure 7:
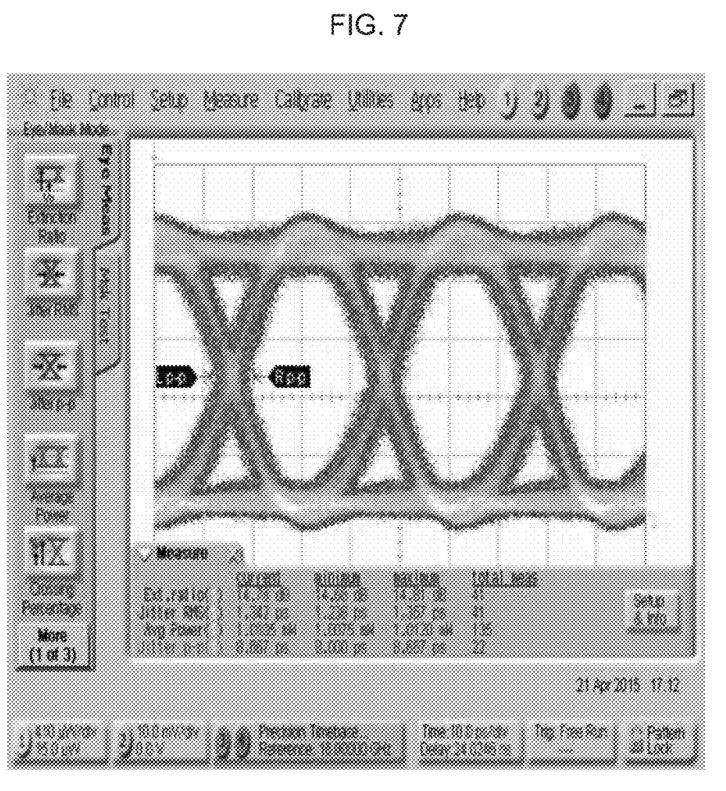
FIG. 7 illustrates an example optical eye diagram of an input in accordance with one or more aspects of the present disclosure.
Figure 8A:
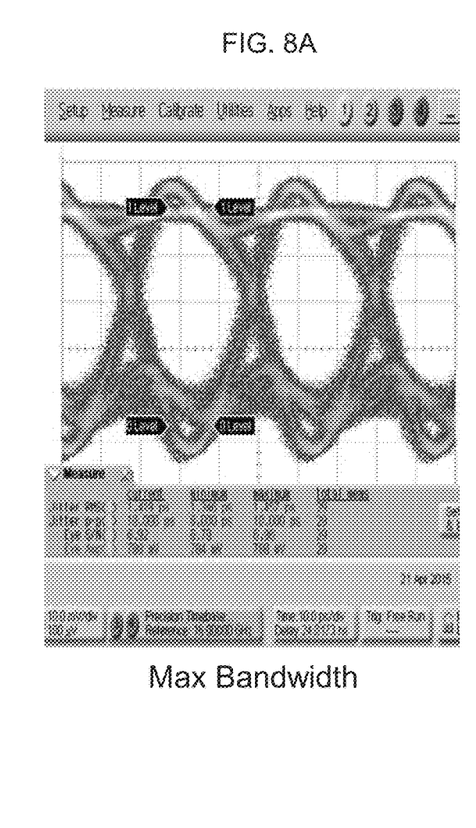
FIG. 8A illustrates an example optical eye diagram of an output of a TIA in a context of maximum bandwidth in accordance with one or more aspects of the present disclosure.
Figure 8B:
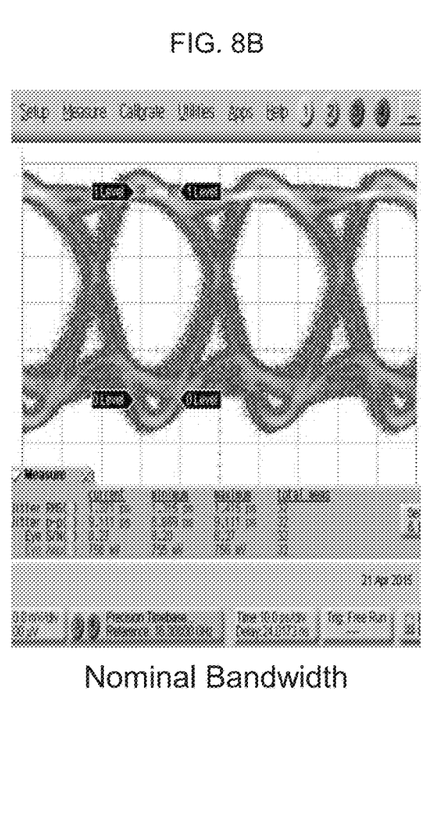
FIG. 8B illustrates an example optical eye diagram of an output of a TIA in a context of nominal bandwidth in accordance with one or snore aspects of the present disclosure.
Figure 8C:
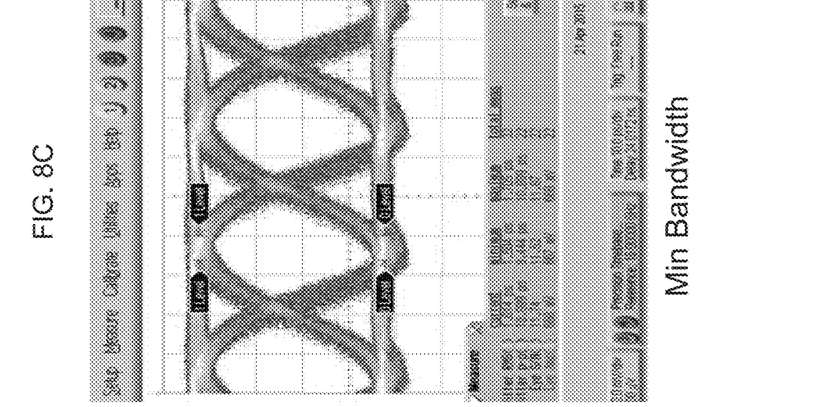
FIG. 8C illustrates an example optical eye diagram of an output of a TIA in a context of minimum bandwidth in accordance with one or more aspects of the present disclosure.

For example, FIG. 7 illustrates an optical eye diagram for an input signal. As shown, the optical eye diagram depicts the left and right peak-to-peak points at the left-most crossing. Likewise, FIGS. 8A-C illustrate optical eye diagrams for the output signal of the TIA 400 in the context of maximum bandwidth, nominal bandwidth, and minimum bandwidth, respectively. As shown, the output of the TIA 400 using the above-described core TIA 300 shows that the TIA 400 provides very high input sensitivity and large bandwidth.

As described above, there are numerous advantages of implementing gain control circuitry, feedback loop circuitry, and input monitoring in the core TIA itself. For example, current steering on a load external to the feedback loop allows the feedback loop to maintain the same constant current, without affecting the working point and linearity. Moreover, by virtue of the gain control circuitry and the separate feedback loop circuitry, the gain on the core TIA is reduced without touching the feedback loop, hence allowing a large dynamic range of gain control with stable frequency response. Since the input feedback loop in not affected by the gain control circuitry, an input monitor circuit can be placed in such loop. In that regard, a TIA having linearity, high sensitivity, and high speed is achieved.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. An apparatus comprising:
   a core trans-impedance amplifier (TIA), wherein the core TIA includes:
   an input for receiving an input signal;
   gain control circuitry;
   feedback loop circuitry;
   an output for outputting an output signal;
   a second stage amplifier configured to receive the output signal of the core TIA and further configured to output a second stage amplifier output signal; and
   an output buffer configured to receive the second stage amplifier output signal,
   wherein the gain control circuitry is configured to receive and perform gain control on the input signal by steering current in at least one of a first direction and a second direction using one or more electrical components, and
   wherein the feedback loop circuitry is arranged between the gain control circuitry and the input, and is configured to maintain constant feedback voltage of the core TIA.

2. The apparatus of claim 1, wherein the second stage amplifier is a fixed gain amplifier and has constant gain.

3. The apparatus of claim 1, wherein the output buffer has constant gain.

4. An apparatus comprising:
   a core trans-impedance amplifier (TIA), wherein the core TIA includes:
   an input for receiving an input signal;
   gain control circuitry;
   feedback loop circuitry; and
   an output for outputting an output signal,
   wherein the gain control circuitry is configured to receive and perform gain control on the input signal by steering current in at least one of a first direction and a second direction using one or more electrical components, wherein the one or more electrical components includes a transistor,
wherein the current is steered using at least one of the first transistor and the second transistor, and
wherein the feedback loop circuitry is arranged between the gain control circuitry and the input, and is configured to maintain constant feedback voltage of the core TIA.

5. An apparatus comprising:
a core trans-impedance amplifier (TIA), wherein the core TIA includes:
an input for receiving an input signal;
gain control circuitry;
feedback loop circuitry; and
an output for outputting an output signal,
wherein the gain control circuitry is configured to receive and perform gain control on the input signal by steering current in at least one of a first direction and a second direction using one or more electrical components,
wherein the feedback loop circuitry is arranged between the gain control circuitry and the input, and is configured to maintain constant feedback voltage of the core TIA, and
wherein the first direction is toward a supply source and the second direction is toward a signal output.

6. An apparatus comprising:
a core trans-impedance amplifier (TIA), wherein the core TIA includes:
an input for receiving an input signal;
gain control circuitry;
feedback loop circuitry; and
an output for outputting an output signal,
wherein the gain control circuitry is configured to receive and perform gain control on the input signal by steering current in at least one of a first direction and a second direction using one or more electrical components,
wherein the one or more electrical components includes a transistor,
wherein the feedback loop circuitry is arranged between the gain control circuitry and the input, and is configured to maintain constant feedback voltage of the core TIA, and
wherein the transistor has low impedance and allows for input of current.

7. The apparatus of claim 4, wherein the first transistor is configured to steer more current than the second transistor.

8. An apparatus comprising:
a core trans-impedance amplifier (TIA), wherein the core TIA includes:
an input for receiving an input signal;
gain control circuitry;
feedback loop circuitry;
an output for outputting an output signal; and
an input current monitoring point,
wherein the gain control circuitry is configured to receive and perform gain control on the input signal by steering current in at least one of a first direction and a second direction using one or more electrical components, and
wherein the feedback loop circuitry is arranged between the gain control circuitry and the input, and is configured to maintain constant feedback voltage of the core TIA
wherein the input current monitoring point allows an application using the apparatus to align one or more optical fibers to one or more sensors emitting the input signal into the input of the core TIA.

9. The apparatus of claim 8, wherein the input current monitoring point is included in the feedback loop circuitry.

10. The apparatus of claim 1 wherein the feedback loop circuitry includes at least one of a transistor and a resistor.

11. The apparatus of claim 1, wherein the apparatus is a TIA.

12. The apparatus of claim 11, wherein the TIA is included in a multi-channel TIA configuration and is a first channel among a plurality of channels.

13. A method implemented in a core trans-impedance amplifier (TIA), the method comprising the acts of:
receiving an input signal via an input of the core TIA;
receiving the input signal via gain control circuitry configured in the core TIA;
performing gain control on the input signal via the gain control circuitry by steering current in at least one of a first direction and a second direction using one or more electrical components;
maintaining constant feedback voltage of the core TIA using feedback loop circuitry configured in the core TIA; and
outputting an output signal via an output of the core TIA.
wherein the current is steered using at least one of a first transistor and a second transistor.

14. The method of claim 13, wherein the first direction is toward a supply source and the second direction is toward a signal output.

* * * * *